(12) United States Patent
Hopkins et al.

(10) Patent No.: US 6,501,285 B1
(45) Date of Patent: Dec. 31, 2002

(54) RF CURRENT SENSOR

(75) Inventors: Michael B. Hopkins; Ciaran O'Morain; Francisco Martinez, all of Dublin (IE)

(73) Assignee: Scientific Systems Research Limited (IE)

( * ) Notice: Subject to any disclaimer, the term of this patent is extended or adjusted under 35 U.S.C. 154(b) by 0 days.

(21) Appl. No.: 09/650,256

(22) Filed: Aug. 29, 2000

(30) Foreign Application Priority Data

Jun. 20, 2000 (IE) ......................................... S2000/0499

(51) Int. Cl.⁷ ............................................. G01R 27/26
(52) U.S. Cl. ......................... 324/687; 324/95; 336/174; 336/175
(58) Field of Search ................................ 324/522, 687, 324/258, 95; 336/174, 175, 200, 232

(56) References Cited

U.S. PATENT DOCUMENTS

| 5,041,791 A | * | 8/1991 | Ackerman et al. .......... 324/318 |
| 5,314,603 A | | 5/1994 | Sugiyama et al. |
| 5,472,561 A | | 12/1995 | Williams et al. |
| 5,764,052 A | * | 6/1998 | Renger ........................ 324/258 |
| 5,866,985 A | | 2/1999 | Coultas et al. |
| 5,910,011 A | | 6/1999 | Cruse |

FOREIGN PATENT DOCUMENTS

| JP | 7183468 | 7/1995 |
| JP | 10242656 | 9/1998 |

* cited by examiner

*Primary Examiner*—N. Le
*Assistant Examiner*—Vincent Q. Nguyen
(74) *Attorney, Agent, or Firm*—Thomas M. Freiburger

(57) ABSTRACT

A sensor for detecting RF current flowing in a conductor includes a layer 10 of insulating material with a hole 16 for the passage of the RF conductor 18 in a direction normal to the layer. A plurality of conductive tracks 20, 22 (FIG. 3) on the opposite major surfaces of the layer are selectively joined by a plurality of through-holes each containing conductive material. The conductive material selectively connects the conductive elements 20, 22 to form a plurality of loops (FIG. 4) disposed non-parallel to the layer 10 for inductive coupling to the RF conductor 18.

7 Claims, 3 Drawing Sheets

RF CURRENT SENSOR

BACKGROUND OF THE INVENTION

This invention relates to a sensor for use in the measurement of the radio frequency (RF) current flowing in a conductor, for example in plasma processes such as those used to fabricate semiconductor devices.

Plasmas are widely used to process materials, including etching and depositing layers. Many of the plasma processes are critical steps in the production of electronic devices.

Production plasmas are normally produced by the application of RF voltages (0.1 to 100 mHz) to low pressure gas reactors. The electrical or electro-magnetic field causes a breakdown in the gas and aids the surface modification, etching or deposition of the material in a controlled way. As well as producing the plasma, high frequency voltages are also used to bias the surface being processed in order to enhance the required process. It is well known in the prior art that the current and voltage at the process surface are correlated with process rates, process quality, and surface damage. The current and phase in the absence of a plasma are determined by the chamber impedance and applied voltage. The chamber impedance is also a critical parameter in determining process quality or fault detection/classification.

The plasma is a conducting gas containing electrons and ions that are free to conduct electrical current. The ions have lower mobility than the electrons and the plasma has a current-voltage characteristic similar to a diode. This diode characteristic tends to rectify the applied radio frequency current and generate harmonics. The intensity of the harmonics is correlated to plasma parameters and other process parameters of interest to the process engineer. The harmonics also have an impact on the accuracy of conventional sensors and can cause unwanted damage to circuitry.

In general, in industry the current state of the art recognises the importance of accurate control of chamber impedance, current and voltage levels and harmonic content (see, for example, U.S. Pat. Nos. 5,314,603, 5,472,561, 5,866,985 and 5,910,011). However, the lack of accurate, robust and cost effective sensing and measuring circuits at high power with non-standard and non-linear load impedance have limited the ability of industry to apply many of these techniques. This limits the repeatability of plasma process and has a yield impact that cost industries such as the Semiconductor industry many millions of dollars annually.

There is a need in many industries using plasma processes generated by radio frequency (RF) voltages to measure accurately the current, voltage and the phase between them, at the applied frequency and at higher harmonics in varying non-linear reactive and inductive loads. In some cases several variable frequencies are applied simultaneously.

In principle, voltage and current measurements are straightforward. The standard approach, as described in U.S. Pat. No. 5,325,019, uses a single loop for current sensing and a capacitor for voltage sensing.

An improvement to this circuit is described in U.S. Pat. No. 5,808,415 and uses a sensor having two pick-up loops to increase the accuracy of the current detection. In this case the current-carrying conductor is divided in the region of the sensor and the sensor is inserted between the two parts of the conductor so that the loops lie one on each side of the conductor. The sensor carries the two loops as a pattern of conductive material formed on a layer of insulating material. This allows for a cheap robust sensor that has substantial reduced pick-up of stray field due to external sources of RF or through non-symmetries in the RF field surrounding the current-carrying conductor.

A need now exist for a sensor capable of more accurate measurement of RF current, for use, for example, in the control of increasingly complex plasma processes.

SUMMARY OF THE INVENTION

Accordingly, the present invention provides a sensor for detecting RF current flowing in a conductor, the sensor comprising at least one layer of insulating material, a hole through the layer(s) for the passage therethrough of the RF conductor in a direction substantially normal to the layer(s), a plurality of conductive elements on at least two major surfaces of the layer(s), and a plurality of through-holes in the layer(s) each containing conductive material, the through-holes being so positioned that the conductive material selectively connects the conductive elements on said at least two major surfaces to form with said elements a plurality of loops disposed non-parallel to the layer(s) for inductive coupling to the RF conductor.

Preferably the loops are connected in series and, most preferably, substantially completely surround the hole.

Preferably at least three and most preferably at least eight loops are formed, but the invention allows the fabrication of an arbitrary number of loops and, in general, the greater the number of loops the greater the immunity to external fields or non-uniformity in the magnetic field around the current-carrying conductor. Further, this is achieved without the need to split the current-carrying conductor.

In an embodiment the sensor also incorporates an RF voltage sensor in the form of a layer of conductive material on a surface of one of the layers for capacitive coupling to the RF conductor.

An embodiment of the invention will now be described, by way of example, with reference to the accompanying drawings, in which:

DETAILED DESCRIPTION OF THE PREFERRED EMBODIMENTS

Figure 1:
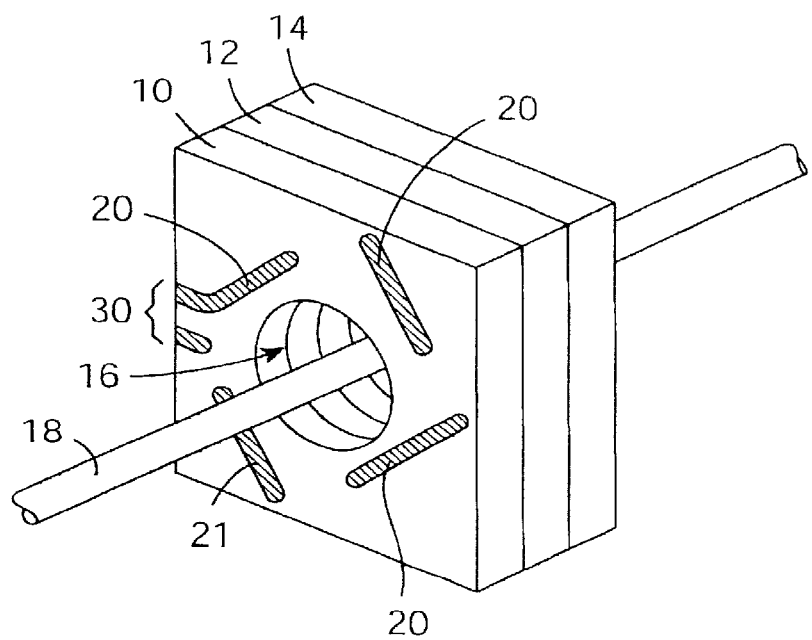
FIG. 1 is a perspective view of an embodiment sensor according to the invention.

Referring to the drawings, an RF current sensor comprises a laminate of three substantially square, flat layers of electrically insulating material 10, 12 and 14. The layers 10–14 may be made of PTFE and bonded together using epoxy resin. The laminate has a central circular hole 16 to allow passage of an RF conductor 18 to pass axially through the sensor. In use, as shown, the sensor is disposed with the layers 10–14 substantially normal to the axis of the conductor 18.

For ease of further description, the front major surface of each insulating layer is taken to be the surface facing towards the left in FIG. 1. Correspondingly, the rear major surface is that facing towards the right. Thus, in the embodiment, the front major surface of the layer 10 is exposed and also the rear major surface of the layer 14, although these may be covered with a protective layer, not shown.

Figure 2:
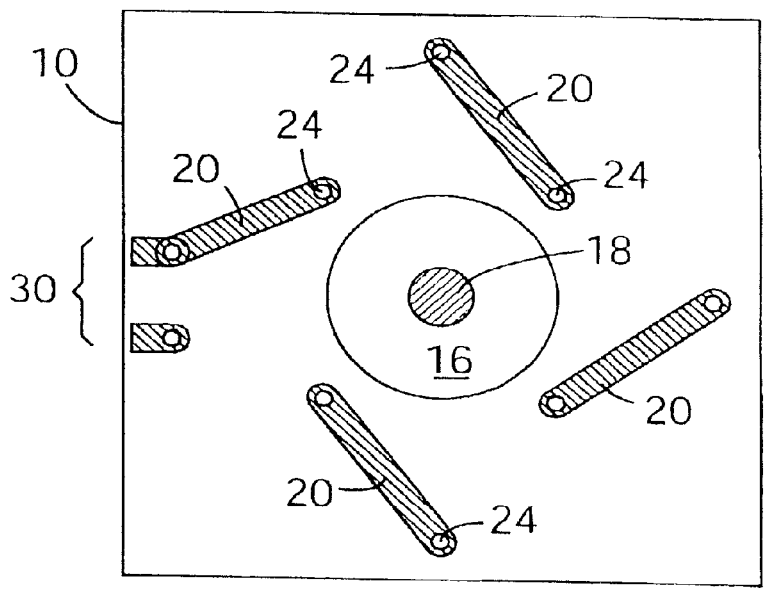
FIG. 2 is a view of the front (exposed) surface of the insulating layer 10 of FIG. 1.
Figure 3:
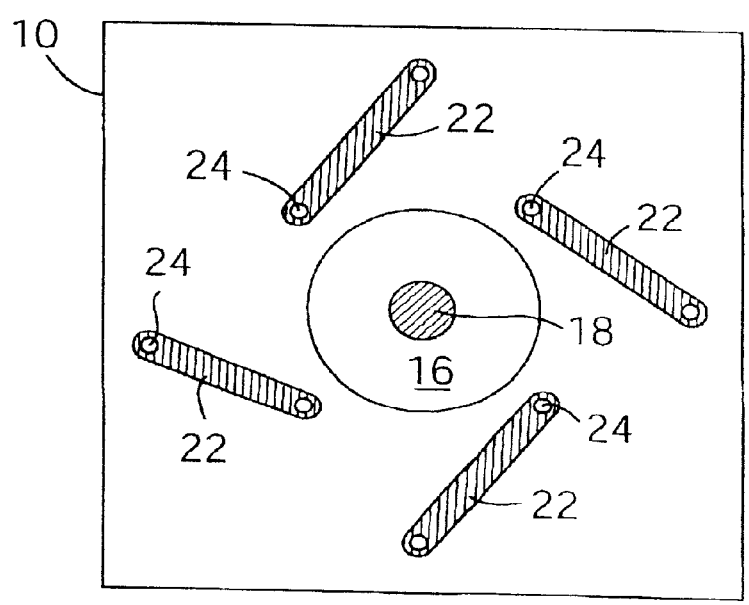
FIG. 3 is a view of the back (hidden) surface of the insulating layer 10 of FIG. 1.

The front major surface of the layer 10 has four symmetrically disposed electrically conductive tracks 20 thereon, as shown in FIG. 2, and a pair of output terminals 30. Likewise, the rear major surface of the layer 10 has four symmetrically disposed electrically conductive tracks 22 thereon, as shown in FIG. 3 (FIG. 3 shows the tracks as if they were seen from the front of the layer 10, i.e. through the thickness of the layer 10).

The layer 10 also has a plurality of through-holes 24 extending through the thickness thereof, each through-hole 24 being internally plated with or otherwise containing electrically conductive material. The through-holes 24 are so positioned that the conductive material therein selectively electrically connects the ends of the tracks 20 to the ends of the tracks 22 in the manner schematically shown in FIG. 4 (in FIG. 4 the vertical lines represent the through-holes).

The conductive tracks 20, 22 and the through holes 24 containing conductive material can be manufactured, prior to lamination of the layer 10 with the other layers 12 and 14, by standard printed circuit manufacturing techniques.

Figure 4:
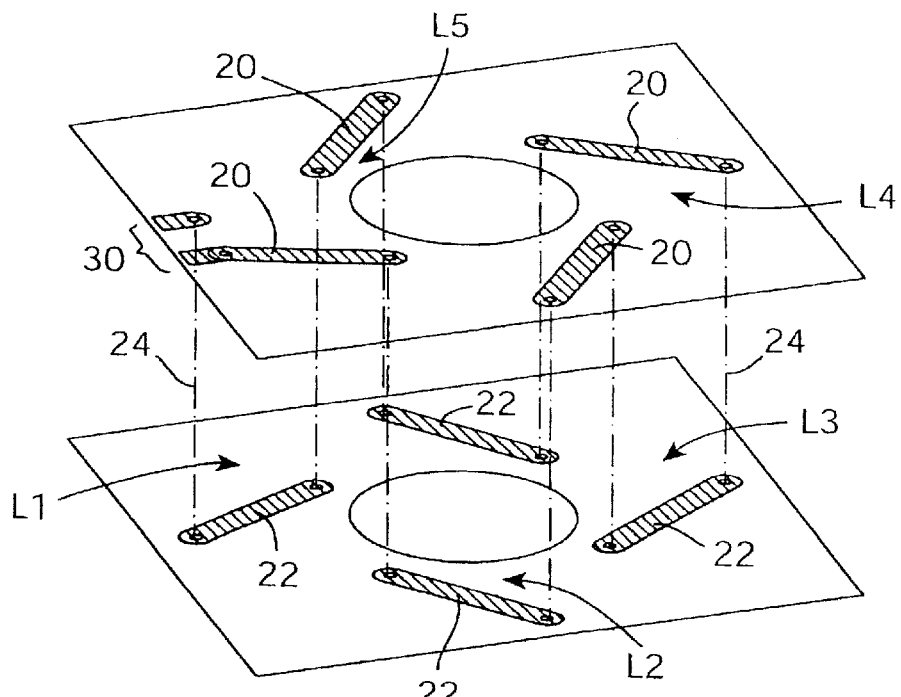
FIG. 4 illustrates how the conductive tracks on the layer 10 are connected via through-holes to form a series of inductive loops.
Figure 5:
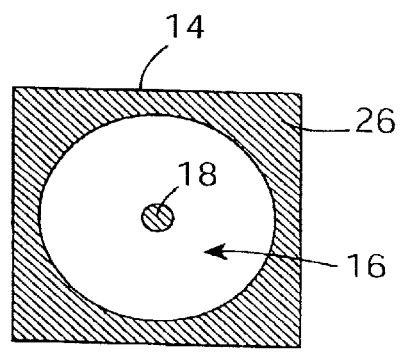
FIG. 5 is a view of the front (hidden) surface of the insulating layer 14.

From FIG. 4 it will be evident that the conductive tracks 20, 22 together with the conductive material in the through-holes 24 form eight inductive loops lying in planes substantially normal to the layers 10–14. Five of the loops L1 to L5 are labelled in FIG. 4, but the remaining three can be readily identified. The eight loops are connected in series between the terminals 30 and substantially completely, and symmetrically, surround the hole 16.

In use of the sensor, as seen in FIG. 1, these loops are inductively coupled to the RF conductor 18, the sum of the voltages induced in the individual loops (i.e. the total voltage appearing across the output terminals 30) being a measure of the RF current in the conductor 18, as is well known.

Although only eight loops are shown, the number of loops can be increased in a very simple manner by increasing the number of conductive tracks 20 and 22 and correspondingly the number of connecting through-holes 24. As the number of loops increases the voltage induced is more and more insensitive to outside fields and non-uniformity in the magnetic field around the inner current-carrying conductor 18.

The sensor also includes an RF voltage detector in the form of a layer of conductive material 26 substantially co-extensive with the front major surface of the layer 14, i.e. the surface immediately facing the rear surface of the layer 12, and located between the layers 12 and 14 so as to be electrically insulated from the loops by the thickness of the layer 12. This layer 26 can be a metal or other electrically conductive plate attached to the front major surface of the insulating layer 14.

In use, the capacitance between the metal layer 26 and the RF conductor 18 will give:

$$Vv = RC\, dV/dt$$

and the inductive coupling between the loops and the RF conductor will give:

$$Vi = M\, dI/dt$$

where M is the mutual inductance between the series of loops and the conductor 18, C is the capacitance between the metal layer 26 and the conductor 18, R is a resistance (across which Vv is developed) in series with the metal layer 26, and I and V are respectively the RF current and voltage flowing in the RF conductor 18.

Careful design can insure that the loops have a small capacitance to the RP conductor 19 and a known software correction can remove any remaining voltage signal in the current signal Vi. Likewise, a small current signal will be present in the voltage signal Vv and this can also be removed by both careful design and software correction.

In plasma systems that use multiple frequencies, the output of the high frequency components can swamp low frequency components. This drawback can be avoided by using capacitors to develop the voltages.

An embodiment of sensor constructed as above for use with an RF conductor of 12 mm diameter had the following approximate dimensions:

Layers 10–14: Each 35×35×6 mm.
Diameter of hole 16: 28 mm,
providing an 8 mm gap between the RF conductor and the edge of the hole.

The foregoing embodiment has the inductive loops formed within a single insulating layer 10 by providing conductive tracks on opposite major surfaces of the layer joined by conductive through-holes in the single layer. However, it is possible to have the loops formed within more than one such layer by providing conductive tracks on three or more spaced major surfaces of a laminate and selectively connecting them as appropriate with conductive through-holes in the intervening insulating layers.

Although the voltage detector comprising the metal layer 26 has been shown integrated within the same laminate as the current sensing loops, it is possible to provide the voltage sensor as a separate element.

The invention is not limited to the embodiment described herein which may be modified or varied without departing from the scope of the invention.

What is claimed is:

1. A sensor for detecting RF current flowing in a conductor, the sensor comprising at least one layer of insulating material, a hole through the layer(s) for the passage therethrough of the RF conductor in a direction substantially normal to the layer(s), a plurality of conductive elements on at least two major surfaces of the layer(s), and a plurality of through-holes in the layer(s) each containing conductive material, the through-holes being so positioned that the conductive material selectively connects the conductive elements on said at least two major surfaces to form with said elements a plurality of loops disposed non-parallel to the layer(s) for inductive coupling to the RF conductor, the loops having a non-magnetic core formed by the layer(s) of insulating material.

2. A sensor as claimed in claim 1, wherein the conductive elements are formed on the opposite major surfaces of a single layer of insulating material, and the through-holes pass through the single layer.

3. A sensor as claimed in claim 1, wherein the loops are connected in series.

4. A sensor as claimed in claim 2, wherein the series-connected loops substantially completely surround the hole.

5. A sensor as claimed in claim 4, wherein there are at least eight loops connected in series around the hole.

6. A sensor as claimed in claim 4, wherein the loops are disposed substantially symmetrically around the hole.

7. A sensor as claimed in any preceding claim, wherein the sensor comprises at least two layers of insulating material and further includes an RF voltage sensor in the form of a layer of conductive material on a further major surface of one of the insulating layers for capacitive coupling to the RF conductor, the further major surface on which said conductive layer is formed being separated by the thickness of at least one insulating layer from said at least two major bearing the conductive elements forming part of the loops.

* * * * *